(12) United States Patent
Kim

(10) Patent No.: US 7,064,594 B2
(45) Date of Patent: Jun. 20, 2006

(54) PASS GATE CIRCUIT WITH STABLE OPERATION IN TRANSITION PHASE OF INPUT SIGNAL, SELF-REFRESH CIRCUIT INCLUDING THE PASS GATE CIRCUIT, AND METHOD OF CONTROLLING THE PASS GATE CIRCUIT

(75) Inventor: Jae-hoon Kim, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 29 days.

(21) Appl. No.: 10/888,718

(22) Filed: Jul. 9, 2004

(65) Prior Publication Data

US 2005/0088219 A1    Apr. 28, 2005

(30) Foreign Application Priority Data

Oct. 24, 2003    (KR) .................. 10-2003-0074675

(51) Int. Cl.
*H03K 3/12*    (2006.01)
(52) U.S. Cl. .................. 327/199; 327/73; 327/200; 327/403; 327/404
(58) Field of Classification Search ............. 327/72, 327/73, 199, 200, 201, 202, 203, 204, 205, 327/206, 207, 208, 209, 210
See application file for complete search history.

(56) References Cited

U.S. PATENT DOCUMENTS

| 4,588,905 A | * | 5/1986 | Kojima ................ 327/166 |
| 4,874,971 A | * | 10/1989 | Fletcher ................ 327/399 |
| 5,459,416 A | * | 10/1995 | Ghia et al. ............... 327/34 |
| 5,719,878 A | * | 2/1998 | Yu et al. ............... 714/726 |
| 5,831,462 A | * | 11/1998 | Witt et al. ............. 327/199 |
| 5,926,051 A | * | 7/1999 | Furutani ................ 327/198 |
| 5,939,915 A |  | 8/1999 | Curran ................ 327/202 |
| 5,949,266 A | * | 9/1999 | Hinds et al. ............ 327/208 |
| 5,986,482 A | * | 11/1999 | Suzuki ................. 327/99 |
| 6,091,277 A | * | 7/2000 | Fujii .................. 327/407 |

FOREIGN PATENT DOCUMENTS

JP    06-045880    2/1994

* cited by examiner

*Primary Examiner*—Kenneth B. Wells
*Assistant Examiner*—Khareem E. Almo
(74) *Attorney, Agent, or Firm*—Mills & Onello LLP

(57) ABSTRACT

Provided is a pass gate circuit capable of operating stably in a transition phase of an input signal, a self-refresh circuit including the pass gate circuit, and a method of controlling the pass gate circuit. The pass gate circuit according to the present invention includes a pass gate unit and a pass gate control unit. The pass gate unit delays an input signal for a fixed duration and outputs the delayed input signal as an output signal in response to a switching control signal. The pass gate control unit outputs the switching control signal, and in response to an internal control signal, determines the existence of a transition in the input signal, and enables or disables the switching control signal according to the determination. The pass gate circuit, the self-refresh circuit including the same, and the control method of the pass gate circuit are capable of operating stably in the transition phase of the input signal.

16 Claims, 4 Drawing Sheets

PASS GATE CIRCUIT WITH STABLE OPERATION IN TRANSITION PHASE OF INPUT SIGNAL, SELF-REFRESH CIRCUIT INCLUDING THE PASS GATE CIRCUIT, AND METHOD OF CONTROLLING THE PASS GATE CIRCUIT

BACKGROUND OF THE INVENTION

This application claims the priority of Korean Patent Application No. 2003-74675, filed on Oct. 24, 2003, in the Korean Intellectual Property Office, the contents of which are incorporated herein in their entirety by reference.

1. Field of the Invention

The present invention relates to a switching circuit, and more particularly, to a pass gate circuit.

2. Description of the Related Art

In general, a pass gate circuit is used in various parts of a semiconductor memory device in which switching operations are needed. For example, a pass gate circuit can be used in a data output circuit of a semiconductor device that includes a latch circuit. A pass gate circuit responds to a predetermined control signal by being turned on/off, and when turned on, receives and outputs input signals. An example of a latch circuit including a pass gate circuit is disclosed in U.S. Pat. No. 5,939,915.

An example of a conventional pass gate circuit is shown in FIG. 1. Referring to FIG. 1, the pass gate circuit 10 includes a switching unit 20 and a latch unit 30. The switching unit 20 includes a transmission gate 21 and an inverter 22 and the latch unit 30 includes inverters 31 and 32. The transmission gate 21 turns on or off in response to an external control signal (CTL).

The conventional pass gate circuit 10 with the above-described structure operates unstably when the level of the input signal (IN) and the level of the control signal (CTL) change at the same time. FIG. 2 illustrates an example in which the level of the input signal (IN) and level of the control signal (CTL) change at the same time. Referring to FIG. 2, when the input signal (IN) changes from a high level to a low level the control signal also changes from a high level to a low level. The transmission gate 21 of the pass gate circuit 10 is turned on when the control signal (CTL) is at a high level and is turned off when the control signal (CTL) is at a low level.

Ideally, the level of the output signal (OUT) of the pass gate circuit 10 changes to the same level as the input signal (IN) as shown in the portion of the signal OUT indicated by "A". The pass gate circuit 10 operates normally when the level of the input signal (IN) changes at a time when there is no level change of the control signal.

However, the pass gate circuit 10 operates unstably and abnormally when the level of the input signal (IN) and the level of the control signal (CTL) change at the same time. That is, as in the case illustrated by "B" which indicates the level of the output signal (OUT) of the pass gate circuit 10, only after a predetermined delay does the level of the output signal (OUT) become identical with the level of the input signal (IN). In addition, as indicated by "C" the pass gate circuit 10 can output an incorrect output signal (OUT), which is different from the input signal (IN). Such problems are aggravated by shorter switching periods of the pass gate circuit 10.

Also, when such a pass gate circuit is used in a self-refresh circuit of a semiconductor memory device, which requires precise operation, the self-refresh circuit can carry out an incorrect operation due to unstable operation of the pass gate circuit.

SUMMARY OF THE INVENTION

The present invention provides a pass gate circuit capable of operating stably in a transition phase of an input signal.

The present invention also provides a self-refresh circuit including the pass gate circuit, which is capable of operating stably in a transition phase of an input signal.

The present invention also provides a method of controlling the pass gate circuit capable of operating stably in a transition phase of an input signal.

According to an aspect of the present invention, there is provided a pass gate circuit including a pass gate unit and a pass gate control unit. The pass gate unit delays an input signal for a fixed duration and outputs the delayed input signal as an output signal in response to a switching control signal. The pass gate control unit outputs the switching control signal, wherein, in response to a first internal control signal, the pass gate control unit determines the existence of a transition in the input signal, and enables or disables the switching control signal according to the determination.

In one embodiment, the pass gate unit comprises: a first delay circuit, which receives the input signal, delays it for a first fixed duration, and outputs the delayed input signal as an internal signal; a switching circuit, which turns on when the switching control signal is enabled and turns off when the switching control signal is disabled, and receives and outputs the internal signal when turned on; a second delay circuit, which receives the internal signal, delays it for a second fixed duration, and outputs the delayed internal signal as an output signal; and a latch circuit, which maintains the level of the internal signal at a predetermined level and is connected between the switching circuit and the second delay circuit. The switching circuit can include: an inverter, which reverses the switching control signal; and a transmission gate, which turns on or off in response to the switching control signal and an inverted switching control signal.

In one embodiment, the pass gate control unit comprises: a delay circuit, which receives the first internal control signal, delays it for the fixed duration, and outputs the delayed first internal control signal as a second internal control signal; and a comparator, which compares the level of the input signal with that of the output signal in response to the first internal control signal and outputs a comparison signal; and an output circuit, which outputs the switching control signal in response to the second internal control signal and the comparison signal. The pass gate control unit can further include a controller, which outputs the first internal control signal. In one embodiment, the comparator is enabled when the first internal control signal is disabled and is disabled when the switching control signal is disabled. In one embodiment, when the level of the input signal is the same as that of the output signal, the comparator determines that a transition of the input signal does not exist and disables the comparison signal, and when the level of the input signal is different from that of the output signal, the comparator determines that a transition of the input signal exists and enables the comparison signal. In one embodiment, the output circuit enables the switching control signal when either one of the second internal control signal and the comparison signal is enabled, and disables the switching control signal when both the second internal control signal and the comparison signal are disabled.

According to another aspect of the present invention, there is provided a self-refresh circuit of a semiconductor memory device including a memory cell array. The self-refresh circuit includes a counter, a pass gate circuit, a self-refresh controller, and a self-refresh operation unit. The counter is enabled or disabled responding to the refresh control signal and when enabled creates an input pulse signal periodically. The pass gate circuit is enabled or disabled responding to the refresh control signal and when enabled receives and delays the input pulse signal and outputs the delayed input pulse signal as an output pulse signal. The pass gate circuit includes a pass gate unit and a pass gate control unit. The pass gate unit delays the input pulse signal for a fixed duration and outputs the delayed input pulse signal as the output pulse signal in response to a switching control signal. The pass gate control unit outputs the switching control signal, wherein, in response to an internal control signal, the pass gate control unit determines the existence of a transition in the input pulse signal, and enables or disables the switching control signal according to the determination.

The self-refresh controller creates an internal address signal in response to the output pulse signal. The self-refresh operation unit consecutively enables word lines of the memory cell array in response to the internal address signal and performs the self-refresh operation.

According to another aspect of the present invention, there is provided a method of controlling a pass gate circuit which includes (a) delaying a first internal control signal and outputting the delayed signal as a second internal control signal; (b) outputting a switching control signal having a logic level that depends on the second internal control signal and the comparison signal; (c) selectively outputting and blocking an output signal based on the state of the switching control signal, the output signal being obtained by delaying an input signal; and (d) comparing the level of the input signal with that of the output signal when the first internal control signal is disabled and enabling or disabling the comparison signal according to the result. In one embodiment, in (b), the switching control signal is enabled when at least one of the second internal control signal and the comparison signal is enabled, and is disabled when both the second internal control signal and the comparison signal are disabled.

In one embodiment, step (d) includes stopping the comparison operation when the switching control signal is disabled.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention.

DETAILED DESCRIPTION OF THE INVENTION

Figure 1:
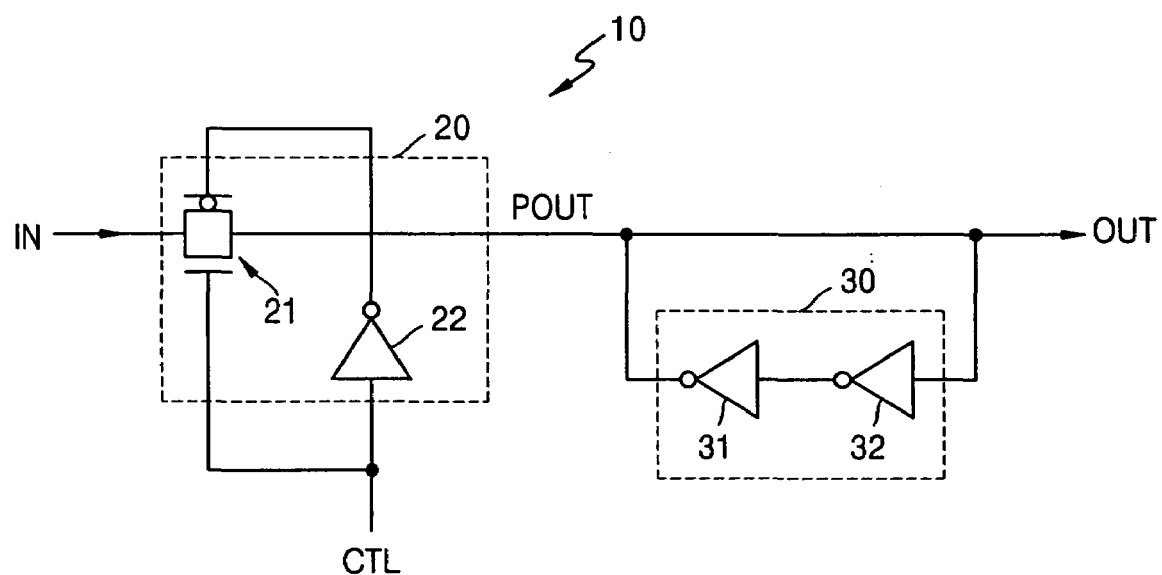
FIG. 1 is a schematic block diagram of a conventional pass gate circuit.
Figure 2:
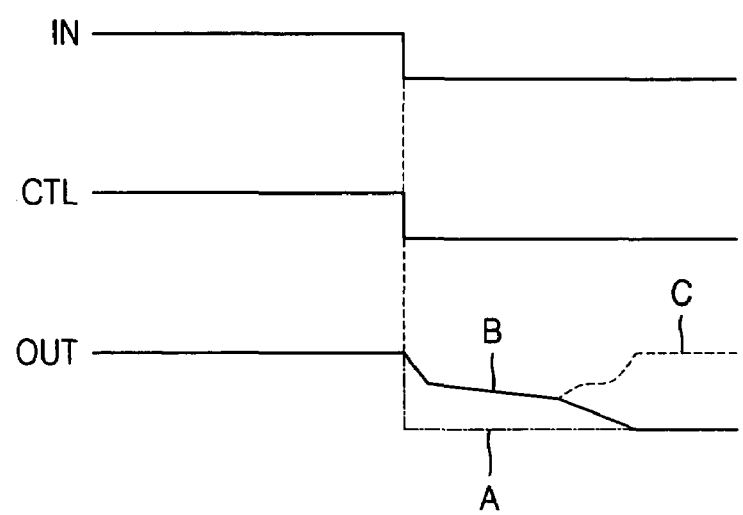
FIG. 2 is a timing diagram of signals used in the pass gate circuit shown in FIG. 1.
Figure 3:
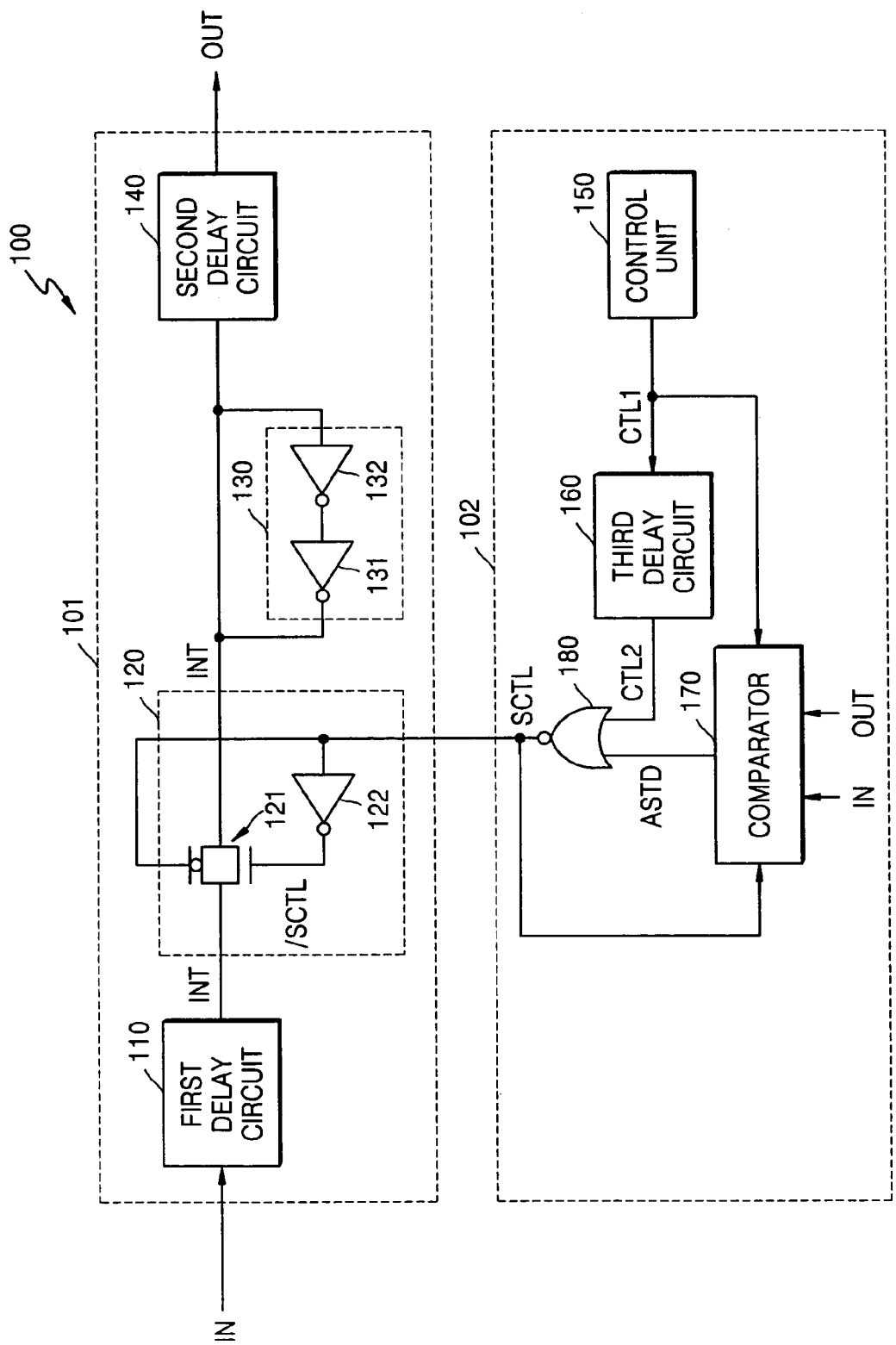
FIG. 3 is a schematic block diagram of a pass gate circuit according to one embodiment of the present invention.

FIG. 3 illustrates a pass gate circuit 100 according to the present invention. As illustrated in FIG. 3, the pass gate circuit 100 includes a pass gate unit 101 and a pass gate control unit 102. The pass gate unit 101 includes a first delay circuit 110, a switching circuit 120, a latch circuit 130, and a second delay circuit 140. In addition, the pass gate control unit 102 includes a control unit 150, a third delay circuit 160, a comparator 170, and an output circuit 180.

The first delay circuit 110 receives an input signal (IN) and after a delay of a first fixed duration outputs the delayed input signal (IN) as an internal signal (INT). The switching circuit 120 includes a transmission gate 121 and an inverter 122. The inverter 122 inverts a switching control signal (SCTL) and outputs the inverted switching control signal (/SCTL). The transmission gate 121 turns on or off in response to the switching control signal (SCTL) and the inverted switching control signal (/SCTL). When the transmission gate 121 turns on, it receives and outputs the internal signal (INT). The latch circuit 130 includes inverters 131 and 132. The inverters 131 and 132 keep stable the level of the internal signal (INT), which is outputted from the transmission gate 121. The second delay circuit 140 delays the internal signal (INT) for a second fixed duration, and outputs the delayed internal signal (INT) as an output signal (OUT).

Next, the controller 150 outputs a first internal control signal (CTL1). The third delay circuit 160 delays the first internal control signal (CTL1) for a third fixed duration and outputs the delayed first internal control signal (CTL1) as a second internal control signal (CTL2). The comparator 170 compares the level of the input signal (IN) with the level of the output signal (OUT) and outputs a comparison signal (ASTD) based on the comparison. The comparator 170 is enabled in response to the first internal control signal (CTL1) and disabled in response to the switching control signal (SCTL).

The output circuit 180 can be realized in the form of a NOR gate. The NOR gate 180 responds to the second internal control signal (CTL2) and the comparison signal (ASTD) and outputs the switching control signal (SCTL).

Figure 4:
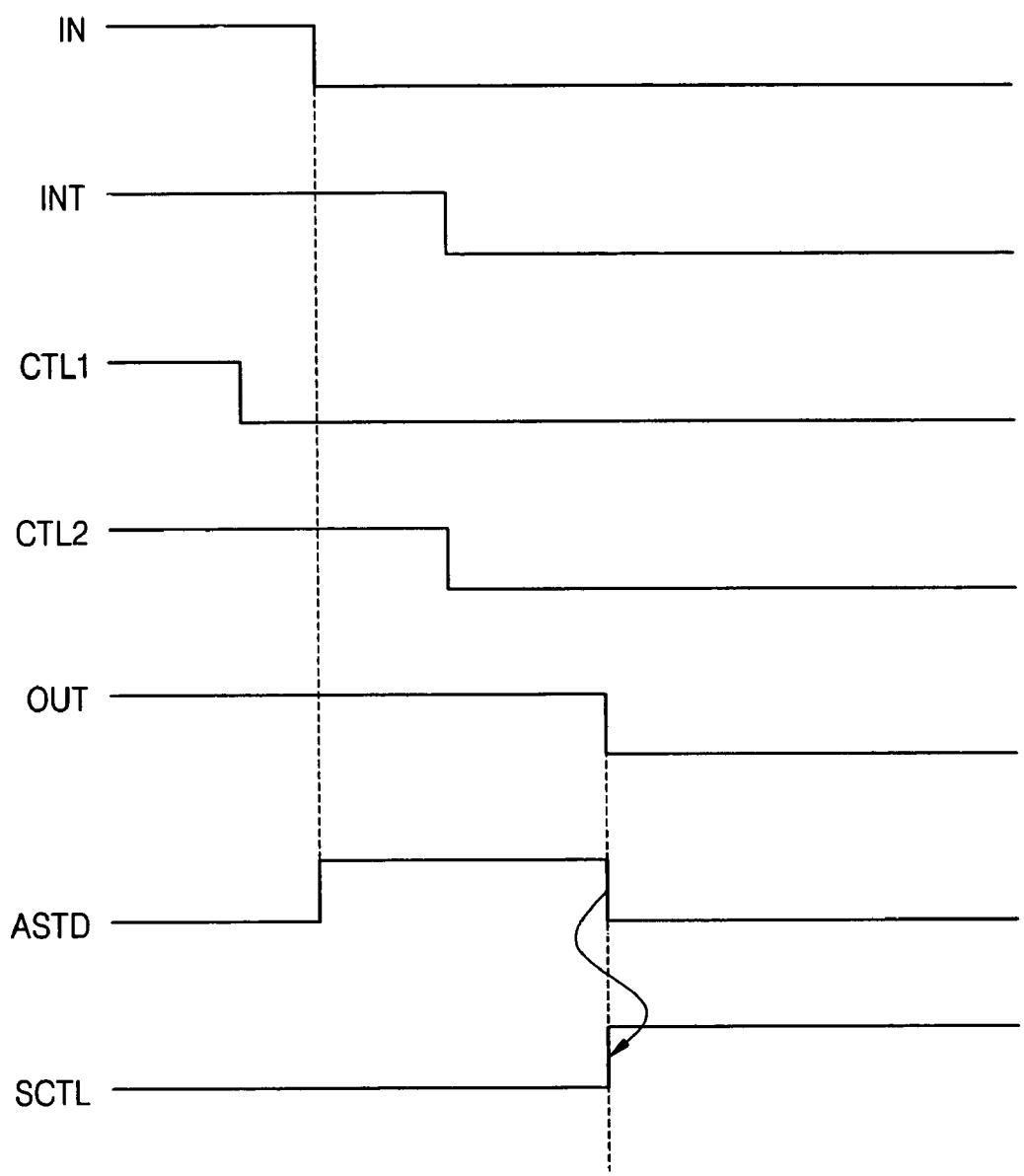
FIG. 4 is a timing diagram of signals used in the pass gate circuit shown in FIG. 3.

Referring to FIGS. 3 and 4, a description of an operation of the pass gate circuit according to the present invention follows. FIG. 4 is a timing diagram of the main signals used in the pass gate circuit shown in FIG. 3.

The control unit 150 outputs a high-level first internal control signal (CTL1). The third delay circuit 160 delays the first internal control signal (CTL1) for a third fixed duration and outputs the delayed signal as the second internal control signal (CTL2). The NOR gate 180 outputs a switching control signal (SCTL) in response to the second internal control signal (CTL2) and the comparison signal (ASTD). Since the comparator 170 is disabled, the comparison signal (ASTD) is in a low-level state. Since the second internal control signal (CTL2) is high and the comparison signal (ASTD) is low, the NOR gate 180 outputs a low-level switching control signal (SCTL).

The inverter 122 inverts the low-level switching control signal (SCTL) and outputs a high-level inverted switching control signal (/SCTL). The transmission gate 121 is turned on in response to the switching control signal (SCTL) and the inverted switching control signal (/SCTL). The transmission gate 121 receives and outputs the internal signal (INT). The internal signal (INT) is output from the first delay circuit 110 and is obtained by delaying the input signal (IN)

for the first fixed duration. The latch circuit 130 keeps stable the level of the internal signal (INT) output by the transmission gate 121. The second delay circuit 140 receives the internal signal (INT), delays it for a second fixed duration, and outputs the delayed signal as the output signal (OUT).

Later on, the controller 150 outputs the first internal control signal (CTL1) at a low level to turn off the transmission gate 121. The third delay circuit 160 delays the first internal control signal (CTL1) for a third fixed duration and outputs the delayed signal as a second internal control signal (CTL2).

When the first internal control signal (CTL1) changes into a low level, the comparator 170 is enabled in response to the first internal control signal (CTL1). The comparator 170 compares the level of the input signal (IN) with that of the output signal (OUT). When the level of the input signal (IN) is the same as that of the output signal (OUT), it is determined that a change in logic level, that is, a phase transition, of the input signal (IN) does not exist and the comparator 170 continues to maintain the comparison signal (ASTD) at a low level.

When the level of the input signal (IN) is different from that of the output signal (OUT), the comparator 170 determines that the level of the input signal (IN) is changed and outputs the comparison signal (ASTD) at a high level.

Even when the first internal control signal (CTL1) changes to the low level, since the comparison signal (ASTD) is high, the NOR gate 180 outputs the switching control signal (SCTL) at a low level.

Later on, when the level of the input signal (IN) is the same as that of the output signal (OUT), the comparison signal (ASTD) is outputted again at the low level. Since the second internal control signal (CTL2) and the comparison signal (ASTD) are both low, the NOR gate 180 outputs the switching control signal (SCTL) at the high level. The transmission gate 121 is turned off in response to the switching control signal (SCTL). Furthermore, the comparator 170 is disabled in response to the switching control signal (SCTL).

As described above, the NOR gate 180 maintains the switching control signal (SCTL) at the low level when the comparison signal (ASTD) is a high level. As a result, simultaneous changes of the level of the internal signal (INT), which is the input signal of the transmission gate 121, and the level of the switching control signal (SCTL) can be avoided. Thus, the transmission gate 121 stably operates when the level of the input signal (IN) changes.

Figure 5:
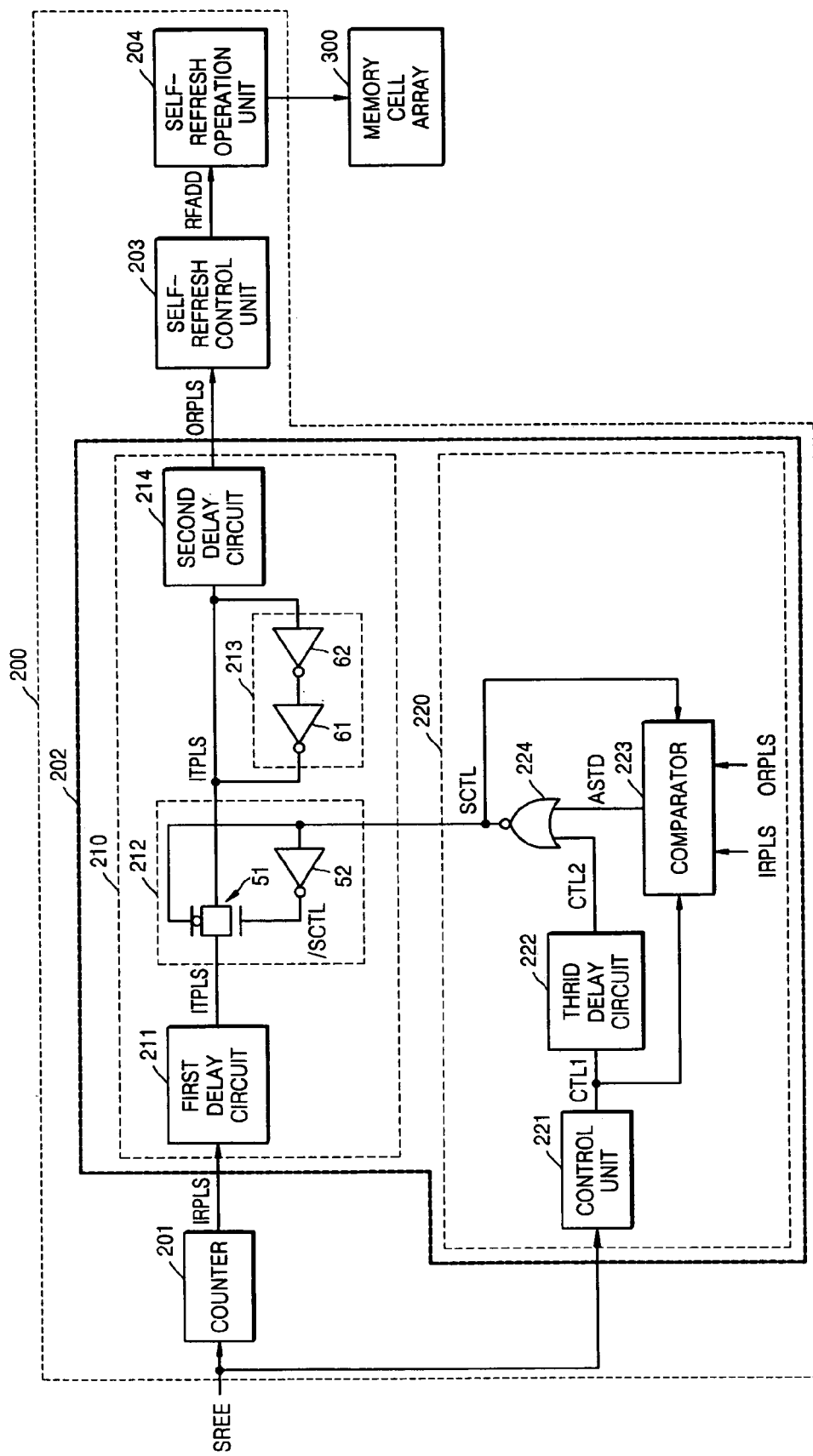
FIG. 5 is a schematic block digram of a self-refresh circuit of a semiconductor memory device including the pass gate circuit according to an embodiment of the present invention.

FIG. 5 illustrates a self-refresh circuit of a semiconductor memory device including a pass gate circuit according to one embodiment of the present invention. The self-refresh circuit 200 includes a counter 201, a pass gate circuit 202, a self-refresh control unit 203, and a self-refresh operation unit 204. The counter 201 generates a pulse signal (IRPLS) periodically in response to a refresh control signal (SREE). The refresh control signal (SREE) is applied externally or is generated by a separate control circuit. The self-refresh circuit 200 either enters or exits a self-refresh mode in response to the refresh control signal (SREE).

The pass gate circuit 202 includes a pass gate unit 210 and a pass gate control unit 220. The pass gate unit 210 is either enabled or disabled in response to the switching control signal (SCTL). When the pass gate unit 210 is enabled it receives the pulse signal (IRPLS), delays the pulse signal (IRPLS) for a predetermined duration, and outputs the delayed pulse signal (IRPLS) as a pulse signal (ORPLS).

In addition, in response to the refresh control signal (SREE) the pass gate control unit 220 outputs the switching control signal (SCTL). Furthermore, in response to the refresh control signal (SREE) the pass gate control unit 220 compares the levels of the pulse signals (IRPLS, ORPLS) and controls the level of the switching control signal (SCTL) according to the comparison result.

Since the structure and detailed operation of the pass gate unit 210 and the pass gate control unit 220 are the same as what is shown in FIG. 3, detailed description thereof will not be repeated.

The self-refresh control unit 203 generates an internal address signal (RFADD) in response to the pulse signal (ORPLS), which it receives from the pass gate circuit 202. The self-refresh operation unit 204, consecutively enables word lines (not shown) of the memory cell array 300 and performs a self-refresh operation in response to the internal address signal (RFADD). The self-refresh operation unit 204 includes a decoder circuit (not shown) and a sense amplifier circuit (not shown).

Next, referring to FIG. 5, the operation of the self-refresh circuit 200 is described in detail. First of all, when the refresh control signal (SREE) is enabled, the counter 201 generates the pulse signal (IRPLS) for each regular cycle.

In addition, in response to the refresh control signal (SREE) the pass gate control unit 220 outputs the switching control signal (SCTL). The following provides a more detailed description of the operation of the pass gate control unit 220. First of all, a control unit 221 outputs a high-level first internal control signal (CTL1) in response to the refresh control signal (SREE). A third delay circuit 222 delays the first internal control signal (CTL1) for a third fixed duration and outputs the delayed signal as a second internal control signal (CTL2). Since the first internal control signal (CTL1) is in a high-level state, a comparator 223 maintains a disabled state. As a result, the comparison signal (ASTD), which is output from the comparator 223, is maintained in a low level state. A NOR gate 224 outputs the low level switching control signal (SCTL) in response to the second internal control signal (CTL2) and comparison signal (ASTD).

The pass gate unit 210 is enabled in response to the switching control signal, (SCTL), delays the pulse signal (IRPLS) for a predetermined duration, and outputs the delayed signal as a pulse signal (ORPLS). A more detailed description of the operation of the pass gate unit 210 will follow. First of all, a first delay circuit 211 delays the pulse signal (IRPLS) for the first fixed duration and outputs the delayed signal as an internal signal (ITPLS). An inverter 52 inverts the switching control signal (SCTL) and outputs an inverted switching control signal (/SCTL) at the high level.

A transmission gate 51 is turned on in response to the low-level switching control signal (SCTL) and high-level inverted switching control signal (/SCTL). The transmission gate 51 receives and outputs the internal signal (ITPLS). The latch circuit 213 keeps stable the level of the internal signal (ITPLS). The second delay circuit 214 delays the internal signal (ITPLS) for a second fixed duration and outputs a delayed version of the internal signal (ITPLS) as the pulse signal (ORPLS).

The self-refresh control unit 203 generates an internal address signal (RFADD) in response to the output of the pulse signal (ORPLS) from the pass gate circuit 202. The self-refresh operation unit 204 consecutively enables the word lines of the memory cell array 300 and performs a self-refresh operation in response to the internal address signal (RFADD).

Later, the counter 201 becomes disabled when the refresh control signal (SREE) is disabled. In addition, the control unit 221 outputs the first internal control signal (CTL1) at a low level in response to the refresh control signal (SREE). The third delay circuit 222 delays the first internal control signal (CTL1) for a third fixed duration and outputs a second internal control signal (CTL2). The comparator 223 is enabled in response to the first internal control signal (CTL1) and compares the levels of the pulse signals (IRPLS, ORPLS).

When the levels of the pulse signals (IRPLS, ORPLS) are the same the comparator 223 determines that there is no level change in the pulse signal (IRPLS) and maintains the comparison signal (ASTD) at a low level.

Since the comparison signal (ASTD) is a low level, when the second internal control signal (CTL2) becomes a low level the NOR gate 224 outputs the switching control signal (SCTL) as a high level.

The transmission gate 51 is turned off in response to the switching control signal (SCTL) and an inverted version of the switching control signal (/SCTL). As a result, the pass gate circuit 202 stops the output of the pulse signal (ORPLS) while the self-refresh control unit 203 and the self-refresh operation unit 204 stop the self-refresh operation of the memory cell array 300.

On the other hand, when the levels of the pulse signals (IRPLS, ORPLS) are different from each other the comparator 223 determines that there is change in level in the pulse signal (IRPLS) and enables the comparison signal (ASTD) to a high level.

Even when the second internal control signal (CTL2) becomes a low level, since the comparison signal (ASTD) is a high level, the NOR gate 224 maintains the switching control signal (SCTL) as a low level.

Later, when the levels of the pulse signals (IRPLS, ORPLS) are the same again, the comparator 223 outputs the comparison signal (ASTD) as a low level. Since both the second internal control signal (CTL2) and the comparison signal (ASTD) are in low-level states, the NOR gate 224 outputs the switching control signal (SCTL) as a high level.

The comparator 223 is disabled in response to the high level of the switching control signal (SCTL). In addition, the transmission gate 51 is turned off in response to the high level of the switching control signal (SCTL) and the low level of the inverted switching control signal (/SCTL). That is, the pass gate circuit 202 stops the output of the pulse signal (ORPLS). As a result, the self-refresh control unit 203 and self-refresh operation unit 204 stops the self-refresh operation of the memory cell array 300.

As described above, when the first internal control signal (CTL1) is a low level the comparator 223 compares the levels of the pulse signals (IRPLS, ORPLS) and determines the existence of level change in the internal signal (ITPLS). In addition, the comparator 223 outputs the comparison signal (ASTD) having a logic level that depends on the comparison result and adjusts when to turn off the transmission gate 51. As a result, the pass gate circuit 202 can stably operate in the transition phase of the pulse signal (IRPLS).

Although an example of a pass gate circuit applied to the self-refresh circuit is used in the description, the pass gate circuit according to the present invention can be applied to various parts of a semiconductor memory device that require switching operations.

As described above, the pass gate circuit, the self-refresh circuit that includes the pass gate circuit, and the control method of the pass gate circuit have the effect of operating stably in the transition phase of the input signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A pass gate circuit comprising:
   a pass gate unit, which delays an input signal for a fixed duration and outputs the delayed input signal as an output signal in response to a switching control signal; and
   a pass gate control unit that outputs the switching control signal, wherein, in response to a first internal control signal, the pass gate control unit determines the existence of a transition in the input signal, and enables or disables the switching control signal according to the determination; wherein the pass gate unit comprises:
   a first delay circuit, which receives the input signal, delays it for a first fixed duration, and outputs the delayed input signal as an internal signal;
   a switching circuit, which turns on when the switching control signal is enabled and turns off when the switching control signal is disabled, and receives and outputs the internal signal when turned on;
   a second delay circuit, which receives the internal signal, delays it for a second fixed duration, and outputs the delayed internal signal as an output signal; and
   a latch circuit, which maintains the level of the internal signal at a predetermined level and is connected between the switching circuit and the second delay circuit.

2. The pass gate circuit of claim 1, wherein the switching circuit comprises:
   an inverter, which reverses the switching control signal; and
   a transmission gate, which turns on or off in response to the switching control signal and an inverted switching control signal.

3. The pass gate circuit of claim 1, wherein the pass gate control unit comprises:
   a delay circuit, which receives the first internal control signal, delays it for the fixed duration, and outputs the delayed first internal control signal as a second internal control signal; and
   a comparator, which compares the level of the input signal with that of the output signal in response to the first internal control signal and outputs a comparison signal; and
   an output circuit, which outputs the switching control signal in response to the second internal control signal and the comparison signal.

4. The pass gate circuit of claim 3, wherein the pass gate control unit further comprises a controller, which outputs the first internal control signal.

5. The pass gate circuit of claim 3, wherein the comparator is enabled when the first internal control signal is disabled and is disabled when the switching control signal is disabled.

6. The pass gate circuit of claim 3, wherein when the level of the input signal is the same as that of the output signal, the comparator determines that a transition of the input signal does not exist and disables the comparison signal, and when the level of the input signal is different from that of the output signal, the comparator determines that a transition of the input signal exists and enables the comparison signal.

7. The pass gate circuit of claim 3, wherein the output circuit enables the switching control signal when either one of the second internal control signal and the comparison signal is enabled, and disables the switching control signal when both the second internal control signal and the comparison signal are disabled.

8. A method of controlling a pass gate circuit comprising:
   (a) delaying a first internal control signal and outputting the delayed signal as a second internal control signal;
   (b) outputting a switching control signal having a logic level that depends on the second internal control signal and a comparison signal;
   (c) selectively outputting and blocking an output signal based on the state of the switching control signal, the output signal being obtained by delaying an input signal; and
   (d) comparing the level of the input signal with that of the output signal when the first internal control signal is disabled and enabling or disabling the comparison signal according to the result.

9. The control method of the pass gate circuit of claim 8, wherein in (b) the switching control signal is enabled when at least one of the second internal control signal and the comparison signal is enabled, and is disabled when both the second internal control signal and the comparison signal are disabled.

10. The control method of the pass gate circuit of claim 9, wherein (d) includes,
    (d1) stopping the comparison operation when the switching control signal is disabled.

11. A self-refresh circuit of a semiconductor memory device including a memory cell array, the self-refresh circuit comprising:
    a counter which is enabled or disabled in response to the refresh control signal and when enabled creates an input pulse signal periodically;
    a pass gate circuit which is enabled or disabled in response to the refresh control signal and when enabled receives and delays the input pulse signal and outputs the delayed input pulse signal; as an output pulse signal;
    a self-refresh controller which creates an internal address signal in response to the output pulse signal; and
    a self-refresh operation unit, which consecutively enables word lines of the memory cell array in response to the internal address signal and performs the self-refresh operation;
    wherein the pass gate circuit comprises:
      a pass gate unit, which, in response to a switching control signal, delays the input pulse signal for a fixed duration and outputs the delayed input pulse signal as the output pulse signal; and
      a pass gate control unit which outputs the switching control signal, wherein, in response to an internal control signal, the pass gate control unit determines the existence of a transition in the input pulse signal, and enables or disables the switching control signal according to the determination.

12. A pass gate circuit comprising:
    a pass gate unit, which delays an input signal for a fixed duration and outputs the delayed input signal as an output signal in response to a switching control signal; and
    a pass gate control unit that outputs the switching control signal, wherein, in response to a first internal control signal, the pass gate control unit determines the existence of a transition in the input signal, and enables or disables the switching control signal according to the determination; wherein the pass gate control unit comprises:
      a delay circuit, which receives the first internal control signal, delays it for the fixed duration, and outputs the delayed first internal control signal as a second internal control signal; and
      a comparator, which compares the level of the input signal with that of the output signal in response to the first internal control signal and outputs a comparison signal; and
      an output circuit, which outputs the switching control signal in response to the second internal control signal and the comparison signal.

13. The pass gate circuit of claim 12, wherein the pass gate control unit further comprises a controller, which outputs the first internal control signal.

14. The pass gate circuit of claim 12, wherein the comparator is enabled when the first internal control signal is disabled and is disabled when the switching control signal is disabled.

15. The pass gate circuit of claim 12, wherein when the level of the input signal is the same as that of the output signal, the comparator determines that a transition of the input signal does not exist and disables the comparison signal, and when the level of the input signal is different from that of the output signal, the comparator determines that a transition of the input signal exists and enables the comparison signal.

16. The pass gate circuit of claim 12, wherein the output circuit enables the switching control signal when either one of the second internal control signal and the comparison signal is enabled, and disables the switching control signal when both the second internal control signal and the comparison signal are disabled.

* * * * *